(12) United States Patent
Kim et al.

(10) Patent No.: US 10,007,454 B2
(45) Date of Patent: Jun. 26, 2018

(54) MEMORY DEVICE AND SYSTEM INCLUDING THE SAME

(71) Applicant: SK hynix Inc., Icheon-si Gyeonggi-do (KR)

(72) Inventors: Jong Sam Kim, Cheongju-si (KR); Jong Yeol Yang, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 95 days.

(21) Appl. No.: 15/350,651

(22) Filed: Nov. 14, 2016

(65) Prior Publication Data

US 2018/0059967 A1 Mar. 1, 2018

(30) Foreign Application Priority Data

Aug. 23, 2016 (KR) .................. 10-2016-0107070
Aug. 23, 2016 (KR) .................. 10-2016-0107071

(51) Int. Cl.
 *G06F 12/00* (2006.01)
 *G06F 3/06* (2006.01)
 *G11C 17/16* (2006.01)
 *G11C 17/18* (2006.01)

(52) U.S. Cl.
 CPC .......... *G06F 3/0619* (2013.01); *G06F 3/0656* (2013.01); *G06F 3/0658* (2013.01); *G06F 3/0673* (2013.01); *G11C 17/16* (2013.01); *G11C 17/18* (2013.01)

(58) Field of Classification Search
 None
 See application file for complete search history.

(56) References Cited

U.S. PATENT DOCUMENTS 8,630,141 B2 1/2014 Tamlyn
9,076,549 B2 7/2015 Kim et al.
2015/0325316 A1 11/2015 Kang et al.

FOREIGN PATENT DOCUMENTS

KR 1020150129421 A 11/2015

*Primary Examiner* — Midys Rojas
(74) *Attorney, Agent, or Firm* — William Park & Associates Ltd.

(57) ABSTRACT

A memory device may include a command controller configured to buffer an address based on a refresh enable signal and a repair enable signal. The memory device may include a fuse circuit configured to control a rupture operation of a refresh cell array and repair cell array corresponding to the address according to the refresh enable signal and the repair enable signal, and output a refresh control signal and a repair control signal during a boot-up operation. The memory device may include a refresh controller configured to control a refresh operation of a bank according to a refresh control signal. The memory device may include a repair controller configured to control a repair operation of the bank according to a redundancy signal.

20 Claims, 10 Drawing Sheets ically rele
MEMORY DEVICE AND SYSTEM INCLUDING THE SAME

CROSS-REFERENCES TO RELATED APPLICATION

The present application claims priority under 35 U.S.C. § 119(a) to Korean application numbers 10-2016-0107070 and 10-2016-0107071, filed on Aug. 23, 2016, in the Korean Intellectual Property Office, which are incorporated herein by reference in their entireties.

BACKGROUND

1. Technical Field

Various embodiments may generally relate to refresh and repair operations of a memory device.

2. Related Art

A memory cell of a memory device includes a transistor serving as a switch and a capacitor for storing charge (data). According to whether the capacitor of the memory cell is charged or not, that is, whether the terminal voltage of the capacitor is high or low, the logic level of data is set to 'high' (logic 1) or 'low' (logic 0).

Since the data is stored in such a form that charges are accumulated in the capacitor, in principle, no power is consumed. However, due to a leakage current caused by a PN junction of a MOS transistor, the initial charges stored in the capacitor may disappear. Thus, the data may be lost.

In order to prevent such a data loss, the data stored in the memory cell must be read, and the memory cell must be recharged according to the read information, before the data is lost. Such an operation must be periodically repeated to retain data. The process of recharging the memory cell is referred to as a refresh operation.

The refresh operation is performed whenever a refresh command is inputted to a memory from a memory controller. The memory controller inputs the refresh command to the memory at each predetermined time, in consideration of the data retention time of the memory.

For example, when the data retention time of the memory is 64 ms and the entire memory cells of the memory can be refreshed only in a case where the refresh command is inputted 8,000 times, the memory controller inputs 8,192 refresh commands to the memory device for 64 ms.

Furthermore, when the data retention times of some memory cells included in the memory do not exceed a defined reference time during a test process of a memory device, the memory device is processed as a fail. The memory device processed as a fail must be discarded.

When all of memory devices including memory cells of which the data retention times do not reach the reference time are processed as fails, the yield inevitably decreases. Furthermore, when a memory cell of which the data retention time does not reach the reference time occurs due to a posterior factor even though the corresponding memory device passed the test, the memory cell may cause an error.

SUMMARY

In an embodiment of the present disclosure, a memory device may be provided. The memory device may include a command controller configured to buffer an address based on a refresh enable signal and a repair enable signal. The memory device may include a fuse circuit configured to control a rupture operation of a refresh cell array and repair cell array corresponding to the address according to the refresh enable signal and the repair enable signal, and output a refresh control signal and a repair control signal during a boot-up operation. The memory device may include a refresh controller configured to control a refresh operation of a bank according to a refresh control signal. The memory device may include a repair controller configured to control a repair operation of the bank according to a redundancy signal.

In an embodiment of the present disclosure, a system may be provided. The system may include: a controller configured to generate a refresh enable signal, a repair enable signal, an address and a command signal. The system may include a memory device configured to rupture a fuse set corresponding to the address based on the refresh enable signal and the repair enable signal, and control a refresh operation and a repair operation of a bank according to a refresh control signal and a repair control signal which correspond to data regarding the rupture of fuse cells during a boot-up operation.

DETAILED DESCRIPTION

Hereinafter, a memory device and a system including the same according to the present disclosure will be described below with reference to the accompanying drawings through examples of embodiments.

Various embodiments may be directed to a memory device capable of selectively performing a PPR (Post Package Repair) operation and an additional refresh operation on a weak address, thereby improving refresh efficiency.

Also, various embodiments may be directed to a memory device including an E-fuse array having improved durability.

Figure 1:
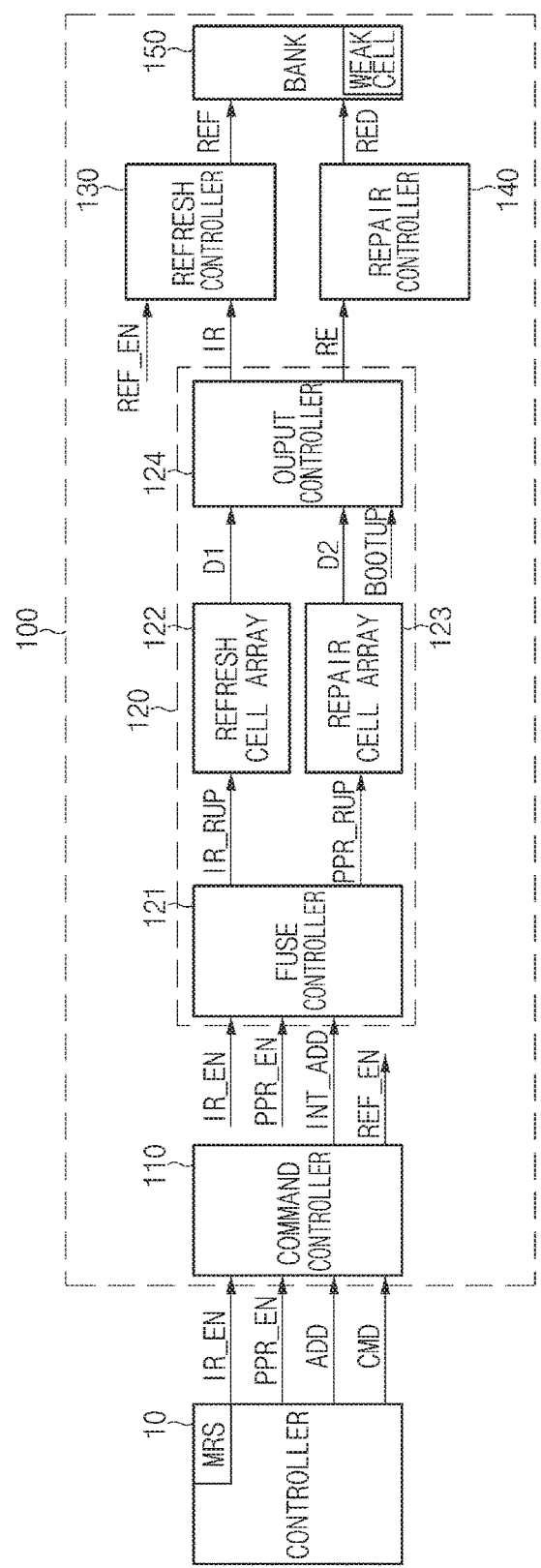
FIG. 1 is a configuration diagram illustrating a representation of an example of a system including a memory device according to an embodiment.

FIG. 1 is a configuration diagram illustrating a representation of an example of a system including a memory device according to an embodiment.

The system according to a present embodiment includes a controller 10 and a memory device 100. The memory device 100 includes a command controller 110, a fuse circuit 120, a refresh controller 130, a repair controller 140 and a bank 150. The fuse circuit 120 includes a fuse controller 121, a refresh cell array 122, a repair cell array 123 and an output controller 124.

The controller 10 outputs a refresh enable signal IR_EN, a repair enable signal PPR_EN, a command signal CMD and an address ADD to the memory device 100. In a present embodiment, the address ADD may be shared and used during a refresh mode and a repair mode.

The refresh enable signal IR_EN and the repair enable signal PPR_EN may be generated by an MRS (Mode Register Set). In an embodiment, the MRS may be included in the controller 10. The refresh enable signal IR_EN and the repair enable signal PPR_EN may be complementarily activated. That is, only any one of the refresh enable signal IR_EN and the repair enable signal PPR_EN may be activated.

The refresh enable signal IR_EN indicates an enable signal for performing an IR (Innovation Refresh) operation, and the IR operation indicates an operation of refreshing a weak cell having a short data retention time.

That is, in order to compensate for a bit at which a refresh fail is likely to occur depending on the environment because the data retention time thereof is short, the IR operation is performed. The IR operation is performed as follows: the address of a bit having a short data retention time, that is, a weak address is ruptured in a fuse, and a refresh operation are additionally performed at a refresh count defined in the specification.

For example, a semiconductor memory device such as DRAM writes data according to charge accumulated in the capacitor of each cell. The charge of the capacitor in the cell disappears in the form of a leakage current to the outside, as the time elapses. In order to block a data loss caused by the leakage current, an operation of reading data and rewriting the read data is required before the data stored in the cell is not completely lost.

Such an operation is referred to as a refresh operation, and may be performed at a constant cycle or by a request of the system. Since the capacitors of the cells have different retention abilities, that is, different data retention times, a weak cell refresh operation considering such a difference is required.

The repair enable signal PPR_EN indicates an enable signal for performing a PPR (Post Package Repair) operation on a fail address.

For example, a semiconductor memory device such as DRAM includes a plurality of memory cells arranged in a matrix shape. However, when a defect occurs in any one memory cell among a large number of memory cells, the semiconductor memory device is processed as a fail because the semiconductor memory device is not operating normally. Furthermore, the increase in integration density and operating speed of the semiconductor memory device raises the probability that a defective cell will occur.

Therefore, the yield inevitably decreases, the yield being expressed by a ratio of the entire number of chips deciding the fabrication cost of DRAM to the number of normal chips. Thus, research has been conducted on a method for efficiently repairing defective cells in order to improve the yield while increasing the integration density and operating speed of the semiconductor memory device.

Examples of the method for repairing a defective cell may include a technology using a repair circuit which replaces a defective cell with a redundancy cell. In general, the repair circuit includes redundancy columns and rows (columns/rows) arranged in columns and rows each including a plurality of redundancy memory cells. The repair circuit selects a redundancy column/row in place of a column/row in which a defect occurred.

That is, when a row and/or column address signal designating a defective cell is inputted, a redundancy column/row is selected instead of a defective column/row of a normal memory cell bank (block).

In order to specify an address designating a defective cell, a plurality of cuttable fuses may be prepared. The plurality of fuses are selectively cut to program the address of the defective cell.

The method for repairing a defective cell in DRAM may be divided into a method for repairing a defective cell at the wafer level and a method for repairing a defective cell at the package level.

The wafer repair method is to replace a defective cell with a redundancy cell after performing a test at the wafer level. Furthermore, the packaging repair method is to replace a defective cell with a redundancy cell at the package level after performing a test at the package level. The method of performing a repair operation at the package level is referred to as the PPR method.

The address ADD indicates an address including information of the corresponding cell when a weak cell refresh operation or PPR operation is performed. That is, the address ADD may include information on a weak address and a fail address which are known by the controller 10.

The command controller 110 processes the refresh enable signal IR_EN, the repair enable signal PPR_EN, the command signal CMD and the address ADD, which are applied from the controller 10, and generates a refresh command signal REF_EN and an internal address INT_ADD. The refresh command signal REF_EN may be generated by the command signal CMD.

The fuse controller 121 generates a refresh rupture signal IR_RUP and a repair rupture signal PPR_RUP for controlling a rupture operation of a fuse, in response to the refresh enable signal IR_EN, the repair enable signal PPR_EN and an internal address INT_ADD.

The fuse controller 121 may determine whether the corresponding mode is a mode for controlling a refresh operation of a weak cell or a mode for controlling a PPR operation, in response to the refresh enable signal IR_EN and the repair enable signal PPR_EN.

That is, the fuse controller 121 decodes the internal address INT_ADD according to the refresh enable signal IR_EN and the repair enable signal PPR_EN, and activates any one of the refresh rupture signal IR_RUP and the repair rupture signal PPR_RUP. That is, the fuse controller 121 decodes the internal address INT_ADD applied from the command controller 110 such that the decoded address corresponds to a fuse array, and controls any one of the refresh rupture signal IR_RUP and the repair rupture signal PPR_RUP.

For example, the fuse controller 121 may determine whether fuse sets are used, and sequentially allocate unused fuse sets to control a rupture operation. That is, when any one of the refresh rupture signal IR_RUP and the repair rupture signal PPR_RUP is activated, the fuse controller 121 may control a refresh rupture or repair rupture operation based on unused addresses while addresses are sequentially allocated.

The refresh cell array 122 ruptures a fuse and outputs data D1 (i.e., output data) indicating the position of a fuse line, in response to the refresh rupture signal IR_RUP. The repair cell array 123 ruptures a fuse and outputs data D2 (i.e., output data) indicating the position of a fuse line, in response to the repair rupture signal PPR_RUP.

The refresh cell array 122 and the repair cell array 123 may include an E-fuse or ARE (Array Rupture Electrical fuse) to store address information of a defective cell.

Recently, the sizes of components forming a semiconductor integrated circuit device have been reduced, and the number of components included in one semiconductor chip has been increased. Thus, the level of defect density has also increased. The increase of the defect density may serve as a direct factor to lower the yield of the semiconductor device. When the defect density significantly increases, a wafer in which the semiconductor device is formed must be discarded.

In order to lower the defect density, a redundancy circuit for replacing a defective cell with a redundancy cell has been suggested. In the case of a semiconductor memory device, the redundancy circuit (for fuse circuit) may be installed at each of row-based lines (for example, word lines) and column-based lines (for example, bit lines).

The redundancy circuit may include the repair cell array 123 to store address information of defective cells. The refresh cell array 122 and the repair cell array 123 are constituted by a plurality of fuse sets including a plurality of fuse wirings. Each of the fuse sets may include E-fuses which program information by melting a fuse using an over-current.

The refresh cell array 122 and the repair cell array 123 are memories which store information on the respective bits of all fail addresses. The refresh cell array 122 and the repair cell array 123 select a corresponding row line according to the refresh rupture signal IR_RUP and the repair rupture signal PPR_RUP which are fuse select information.

Each of the fuse sets programs information by melting a fuse using an over-current. Furthermore, self repair or rupture may be performed to save bit fails at the package level of the memory.

When a memory test is ended, the refresh cell array 122 and the repair cell array 123 permanently store fail information by rupturing electrical fuses corresponding to the respective bits. The refresh cell array 122 and the repair cell array 123 may output the stored row fuse data and column fuse data as data D1 and D2, before the operation of the memory after a power-up operation.

In a present embodiment, the refresh cell array 122 and the repair cell array 123 are illustrated as separate components. However, a present embodiment is not limited thereto, but the refresh cell array 122 and the repair cell array 123 may be divided into two regions and arranged in one array, and each region may be selected by a decoding signal. For example, one region may indicate a region allocated for refresh, and the other region may indicate a region allocated for repair. At this time, a fuse region allocated to an existing row line may be used as the refresh region.

When a boot-up signal BOOTUP is activated, the output controller 124 starts a boot-up operation in order to read the information of the refresh cell array 122 and the repair cell array 123. That is, the output controller 124 scans fuses to use according to the data D1 and D1 containing fuse information, and outputs the refresh control signal IR and the repair control signal RE in response to the boot-up signal BOOTUP.

At this time, before the memory is operated after the power-up operation, the output controller 124 may scan fuse data on the fail addresses stored in the electrical fuses of the refresh cell array 122 and the repair cell array 123.

The refresh controller 130 outputs the refresh signal REF for performing a refresh operation on a weak cell to the bank 150, in response to the refresh command signal REF_EN and the refresh control signal IR.

The repair controller 140 outputs a redundancy signal RED for performing a PPR operation to the bank 150 in response to the repair control signal RE. For example, when a hard fail occurs, the repair controller 140 may substitute a word line by replacing the word line with a redundancy word line.

Figure 2:
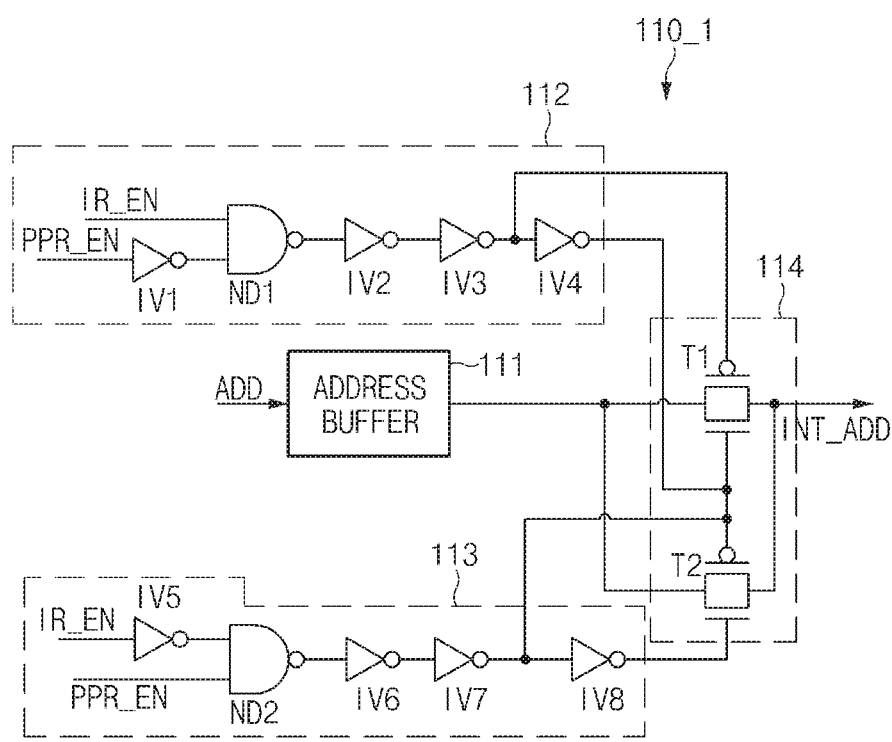
FIG. 2 is a configuration diagram illustrating a representation of an example of a command controller of FIG. 1.

FIG. 2 is a configuration diagram illustrating a representation of an example of the command controller 110 of FIG. 1.

The command controller 110_1 generates the internal address INT_ADD by buffering the address ADD in response to the refresh enable signal IR_EN or the repair enable signal PPR_EN which is applied from the controller 10. The refresh enable signal IR_EN and the repair enable signal PPR_EN are not activated at the same time, but only one of the two signals is activated.

That is, when any one of the refresh enable signal IR_EN and the repair enable signal PPR_EN is activated, the command controller 110_1 buffers the address ADD and outputs the internal address INT_ADD. In a present embodiment, the address ADD may be shared and used during a PPR operation and a refresh operation for a weak cell.

The command controller 110_1 may include an address buffer 111, input circuits 112 and 113 and a selection circuit 114.

The address buffer 111 buffers the address ADD and outputs the buffered address to the selection circuit 114. The input circuits 112 and 113 combine the refresh enable signal IR_EN and the repair enable signal PPR_EN, and controls the selection operation of the selection circuit 114.

The input circuit 112 includes a NAND gate ND1 and a plurality of inverters IV1 to IV4. The NAND gate ND1 performs a NAND operation on the refresh enable signal IR_EN and the repair enable signal PPR_EN inverted by the inverter IV1. The inverters IV2 to IV4 invert and delay an output of the NAND gate ND1. The input circuit 112 having an above-described configuration enables the selection circuit 114 when the refresh enable signal IR_EN is activated.

The input circuit 113 includes a NAND gate ND2 and a plurality of inverters IV5 to IV8. The NAND gate ND2 performs a NAND operation on the refresh enable signal IR_EN inverted by the inverter IV5 and the repair enable signal PPR_EN. The inverters IV6 to IV8 invert and delay an output of the NAND gate ND2. The input circuit 113 having an above-described configuration enables the selection circuit 114 when the repair enable signal PPR_EN is activated.

The selection circuit 114 includes transmission gates T1 and T2. The transmission gate T1 is turned on when the refresh enable signal IR_EN is activated, and transmits an output of the address buffer 111 as the internal address INT_ADD. The transmission gate T2 is turned on when the repair enable signal PPR_EN is activated, and transmits the output of the address buffer 111 as the internal address INT_ADD.

Figure 3:
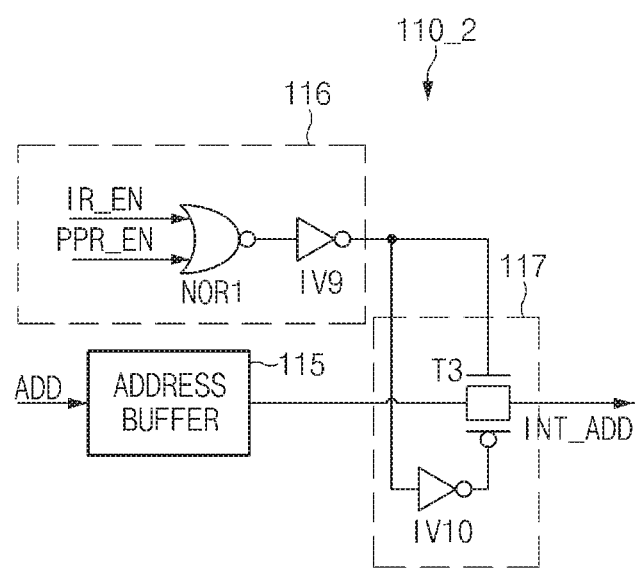
FIG. 3 illustrates a representation of an example of an embodiment of the command controller of FIG. 1.

FIG. 3 illustrates a representation of an example of an embodiment of the command controller 110 of FIG. 1.

The command controller 110_2 includes an address buffer 115, an input circuit 116 and a selection circuit 117.

The address buffer 115 buffers the address ADD and outputs the buffered address to the selection circuit 117. The input circuit 116 combines the refresh enable signal IR_EN and the repair enable signal PPR_EN, and controls the selection operation of the selection circuit 117.

The input circuit 116 includes a NOR gate NOR1 and an inverter IV9. The NOR gate NOR1 performs a NOR operation on the refresh enable signal IR_EN and the repair enable signal PPR_EN. The inverter IV9 inverts an output of the NOR gate NOR1.

The input circuit 116 having an above-described configuration enables the selection circuit 117 when any one of the refresh enable signal IR_EN and the repair enable signal PPR_EN is activated.

The selection circuit 117 includes a transmission gate T3 and an inverter IV10. The transmission gate T3 is turned on when at least one of the refresh enable signal IR_EN and the repair enable signal PPR_EN is activated, and transmits the output of the address buffer 115 as the internal address INT_ADD.

Figure 4:
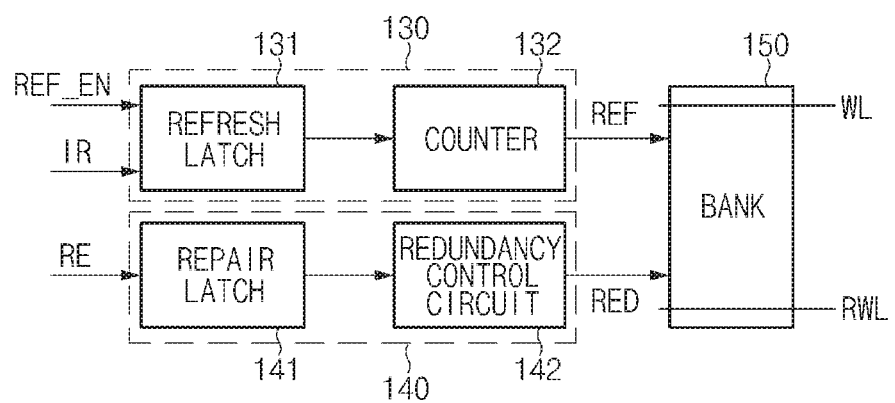
FIG. 4 is a configuration diagram illustrating a representation of an example of a refresh controller and a repair controller of FIG. 1.

FIG. 4 is a configuration diagram illustrating a representation of an example of the refresh controller and the repair controller of FIG. 1.

The refresh controller 130 includes a refresh latch 131 and a counter 132.

The refresh latch 131 latches the refresh control signal IR in response to the refresh command signal REF_EN. The counter 132 counts an output of the refresh latch 131, and outputs the refresh signal REF to the bank 150. For example, when data is stored in the refresh latch 131, the counter 132 counts the refresh control signal IR to perform a refresh operation. On the other hand, when no data are stored in the refresh latch 131, a refresh operation is not performed.

The bank 150 performs an additional refresh operation on a weak cell by selectively enabling a word line WL in response to the refresh signal REF.

The repair controller 140 includes a repair latch 141 and a redundancy control circuit 142.

The repair latch 141 latches the repair control signal RE. The redundancy control circuit 142 outputs the redundancy signal RED for performing a PPR operation to the bank 150 in response to an output of the repair latch 141. The bank 150 performs a repair operation on a fail cell by selectively enabling a redundancy word line RWL in response to the redundancy signal RED.

For example, one PPR operation may be performed as the repair operation on each bank group. On the other hand, the refresh operation can be performed on a plurality of bit fails according to the number of refresh latches 131.

Thus, when a hard fail occurs, the memory device according to a present embodiment saves a fail address through the repair controller 140. Suppose that the number of refresh-based fails occurring in the memory device is larger than the number of hard fails. When a refresh-based fail occurs, the memory device according to a present embodiment performs an additional refresh operation on a weak cell through the refresh controller 130.

That is, the memory device determines the position of a fail bank based on the command signal CMD and the address ADD which are applied from the controller 10. When a hard fail occurs, the memory device activates the repair enable signal PPR_EN to perform a repair operation. Furthermore, when there occurs a large number of refresh-based fails which cannot be handled in the repair mode, the memory device activates the refresh enable signal IR_EN to perform a refresh operation.

When a weak address with a relatively short data retention time occurs, the memory device determines whether to completely save the weak address through a repair operation or to refresh the weak address through an IR operation. That is, the memory device stores a weak address in a fuse and performs an additional refresh operation using the stored address, thereby deciding whether to potentiate the refresh operation.

In a present embodiment, a user may control an MRS included in the controller 10 to change or control the operation mode of the memory device 100. That is, when a user (for example, server) wants, the IR mode can be selected by the controller 10 such that an additional refresh operation of the memory device 100 is performed.

For example, a refresh control device may extend a refresh cycle in order to reduce current consumption. If a refresh fail occurs even though the refresh cycle is extended, the refresh fail may be considered as a refresh-based fail, not a hard fail. The user may set refresh-based fail information through the MRS, and control the controller 10. When MRS information inputted from the user is a refresh-based fail, the controller 10 selects the IR mode to control the memory device to perform an additional refresh operation.

Figure 5:
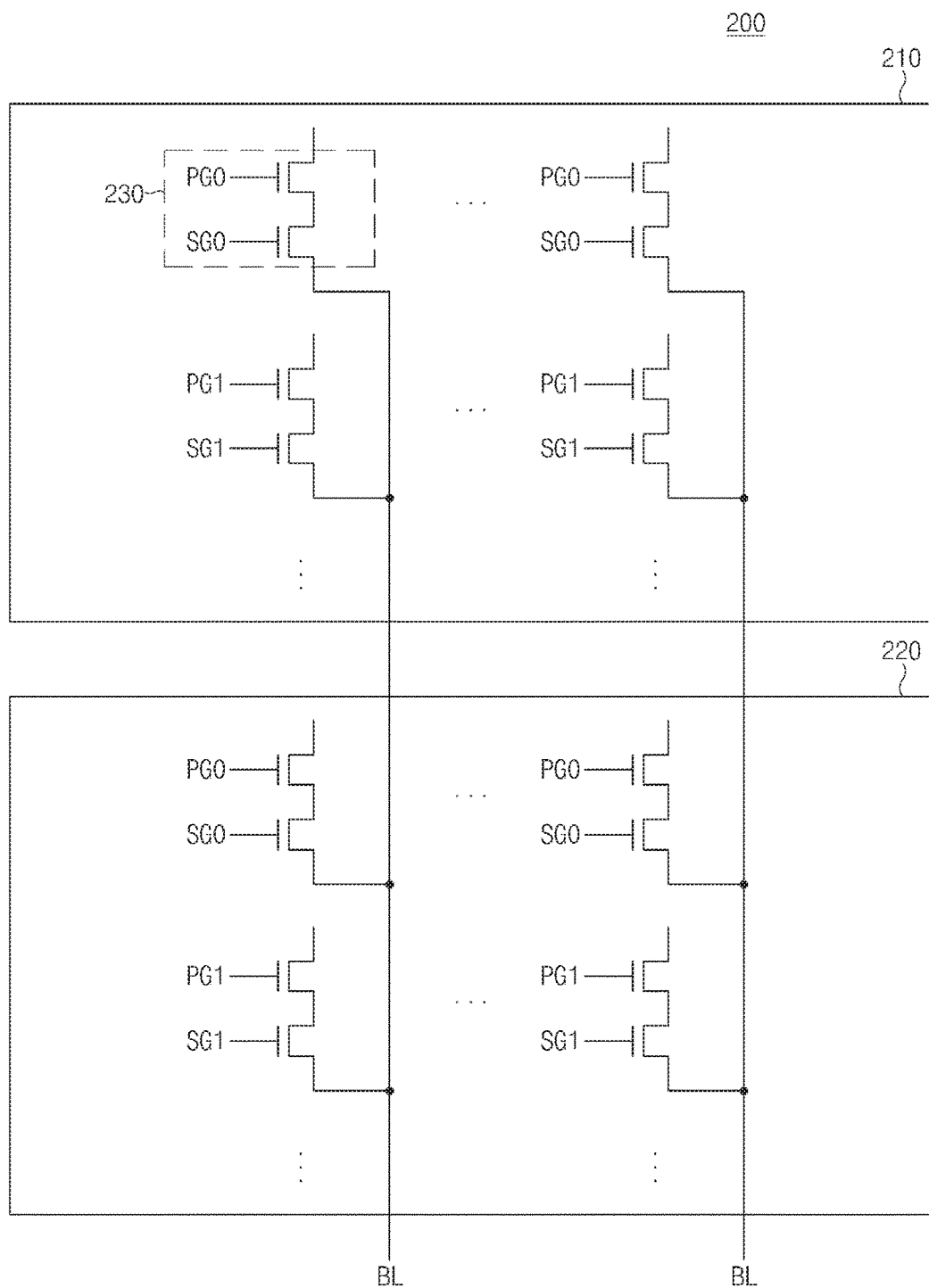
FIG. 5 is a diagram illustrating a representation of an example of the structure of an E-fuse array according to an embodiment.

FIG. 5 is a diagram illustrating a representation of an example the structure of an E-fuse array 200 according to an embodiment.

Referring to FIG. 5, the E-fuse array 200 includes a first region 210 and a second region 220.

The E-fuse array 200 includes a plurality of fuse cells 230 arranged in a matrix shape. Each of the fuse cells 230 includes a program transistor and a selection transistor.

A plurality of fuse cells 230 arranged in the row direction (horizontal direction of FIG. 5) are coupled to a common word line. That is, in the plurality of fuse cells 230 arranged in the row direction, the gates PG of the program transistors are coupled in common, and the gates SG of the selection transistors are coupled in common (i.e., PG0, PG1 . . . , SG0, SG1 . . . ).

A plurality of fuse cells 230 arranged in the column direction (vertical direction of FIG. 5) are coupled to a common bit line. That is, the sources and drains (sources/drains) of the selection transistors of the fuse cells 230 arranged in the column direction are coupled in common.

The first and second regions 210 and 220 of the E-fuse array 200 are arranged in the column direction of the E-fuse array 200, for example. Thus, the first and second regions 210 and 220 may have different word lines and common bit lines.

The first region 210 stores data which are accessed a smaller number of times than data stored in the second region 220. For example, the first region 210 may store initial setting values required during a boot-up operation of the semiconductor device including the E-fuse array 200. The initial setting values may include the address of a fail cell, which is needed during a repair operation, for example.

The second region 220 stores data which are accessed a larger number of times than data stored in the first region 210. For example, the second region 220 may store the address of a cell which needs to be additionally refreshed.

A memory cell may be implemented by a capacitor. That is, data may be stored by charge stored in the capacitor. Since the capacitor is discharged with time, the data may be lost. Therefore, a refresh operation needs to be performed in order to recharge the memory cell within a predetermined time.

In such a memory cell, a progressive defect may occur to lower an actual value for a refresh operation. In other words, unlike a typical error which occurs during a read/write operation, data stored in a memory cell may be lost due to coupling with a surrounding cell, before a preset refresh operation is performed. Such a memory cell may be referred to as a weak cell.

The weak cell can be saved through a typical repair method, that is, a method using a redundancy memory cell with a sufficient size. Specifically, a redundancy memory cell may be additionally prepared to replace (repair) the weak cell.

In this case, however, the size of the E-fuse array (that is, the first region 210) for storing the redundancy memory cell and the addresses of the weak cell and the redundancy memory cell may be increased. Thus, while the area of the chip is increased, the number of dies per wafer and the yield may be reduced.

Therefore, in a present embodiment, the address of the weak cell is stored in the second region 220, and an additional refresh operation is performed on the weak cell.

Figure 6:
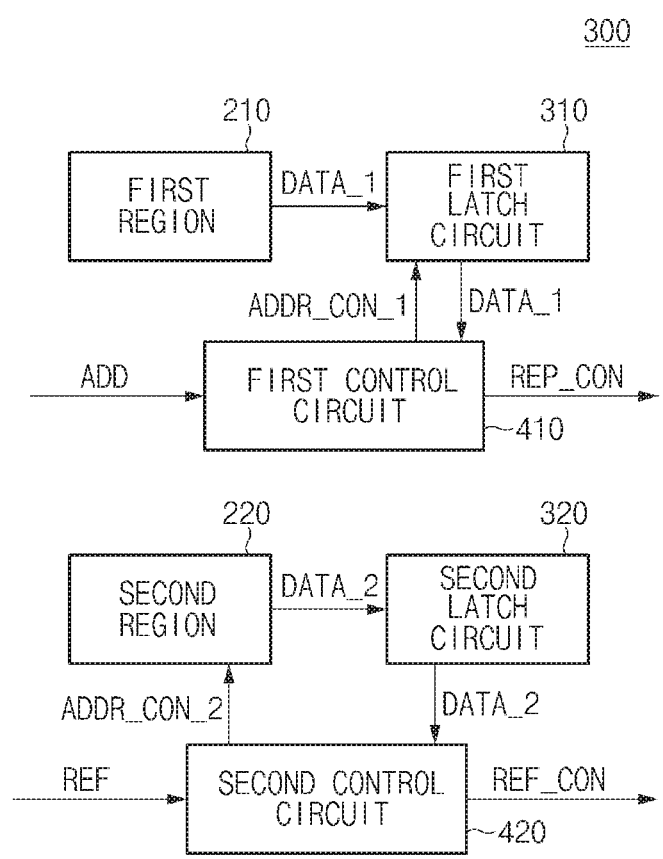
FIG. 6 is a diagram illustrating a representation of an example the configuration of a cell array including the E-fuse array of FIG. 5.

FIG. 6 is a diagram illustrating a representation of an example the configuration of a cell array 300 including the E-fuse array 200 of FIG. 5.

Referring to FIG. 6, the cell array 300 includes a first region 210, a second region 220, a first latch circuit 310, a second latch circuit 320, a first control circuit 410 and a second control circuit 420.

The first region 210 and the second region 220 correspond to the first region 210 and the second region 220 of the E-fuse array 200 illustrated in FIG. 5, respectively. FIG. 6 illustrates that the first and second regions 210 and 220 are separated from each other, but the first and second regions 210 and 220 may be formed adjacent to each other.

In the first region 210, data which are accessed a smaller number of times than data of the second region 220 may be ruptured. The ruptured data may include a fail address and a redundancy address of a redundancy memory cell corresponding to the fail address. In the second region 220, data which are accessed a larger number of times than data of the first region may be ruptured. For example, the data ruptured data may include an address of a weak cell.

FIG. 6 illustrates the cell array 300 as an embodiment different from FIG. 1. However, the embodiments of FIGS. 5 and 6 may correspond to the refresh cell array 122 and the repair cell array 123 of FIG. 2, respectively. For example, the second region 220 may correspond to the refresh cell array 122, and the first region 210 may correspond to the repair cell array 123.

The first latch circuit 310 stores data DATA_1 stored in the first region 210. The first latch circuit 310 may store all of the data DATA_1 stored in the first region 210 during a boot-up operation, for example.

The second latch circuit 320 stores data DATA_2 stored in the second region 220. The second latch circuit 320 may store specific data DATA_2 of the second region 220 based on an address control signal ADDR_CON_2 of the second control circuit 420 described later.

The first control circuit 410 controls the operation of the cell array 300 using the data DATA_1 stored in the first region 210. For example, the first control circuit 410 may serve as a repair control circuit. The data DATA_1 ruptured in the first region 210 may include the address of a fail cell. The address DATA_1 of the fail cell, ruptured in the first region 210, may be stored in the first latch circuit 310 during a boot-up operation of the memory device.

The first control circuit 410 performs a repair operation using the address DATA_1 of the fail cell, stored in the first latch circuit 310. For example, when an access to a specific memory cell is requested, the first control circuit 410 transmits the first address control signal ADDR_CON_1 to the first latch circuit 310. The first latch circuit 310 transmits the address DATA_1 of the fail cell to the first control circuit 410 in response to the first address control signal ADDR_CON_1.

When an input address ADD coincides with the address DATA_1 of the fail cell, the first control circuit 410 generates a repair control signal REP_CON to access a redundancy memory cell instead of the specific memory cell where the access was requested.

The second control circuit 420 controls the memory device using the data stored in the second region 220. For example, the second control circuit 420 may serve as a repair control circuit. The second region 220 may store the address of a weak cell. The second control circuit 420 performs a refresh operation on the entire memory cells at a predetermined cycle, and performs an additional refresh operation on a weak cell among the memory cells.

For example, the second control circuit 420 transmits a second address control signal ADDR_CON_2 to the second region 220 in response to a refresh command REF. The second region 220 transmits data corresponding to the second address control signal ADDR_CON_2, that is, the address DATA_2 of the weak cell to the second latch circuit 320.

The second control circuit 420 reads the address DATA_2 of the weak cell from the second latch circuit 320, and generates the refresh control signal REF_CON to perform an additional refresh operation on the address DATA_2 of the weak cell.

Figure 7:
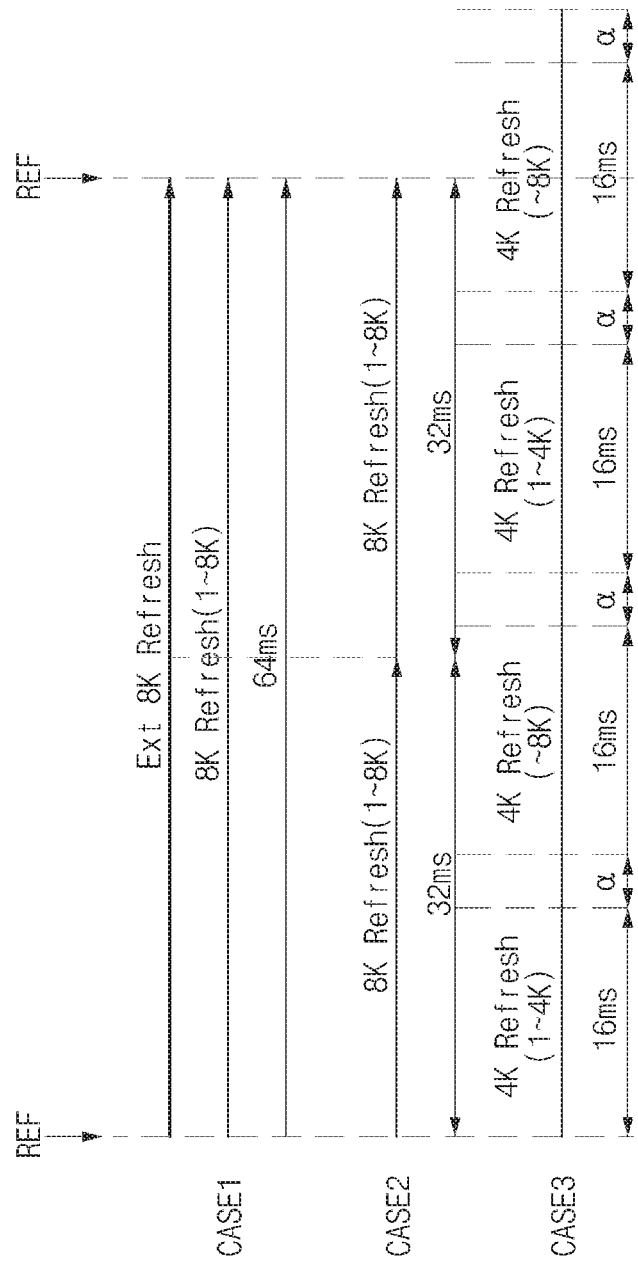
FIG. 7 is a timing diagram illustrating a representation of an example of a refresh operation performed in a second control circuit of FIG. 6.

FIG. 7 is a timing diagram illustrating a representation of an example of the refresh operation which is performed in the second control circuit 420 of FIG. 6.

Referring to FIG. 7, the refresh command REF may be inputted at every 64 ms, for example. The second control circuit 420 may refresh 8K word lines, for example, at each cycle of 64 ms in response to the refresh command REF (Case 1). In a present embodiment, however, a refresh operation is performed two times for 64 ms, that is, at a cycle of 32 ms (Case 2), in order to improve the characteristic of the memory cells.

In addition, an additional refresh operation is performed on a weak cell at each cycle of 16 ms, in order to improve the characteristic of the weak cell (Case 3).

Specifically, referring to Case 3 of FIG. 7, a refresh operation is performed on 4 k word lines corresponding to a half of 8K word lines for 16 ms. Furthermore, during a section α, an additional refresh operation is performed on a word line including a weak cell.

At this time, the address of the weak cell is stored in the second region 220. The second control circuit 420 performs the additional refresh operation using the address of the weak cell, acquired by accessing the second region.

After the additional refresh operation on the word line including the weak cell is ended, the second control circuit 420 performs a refresh operation on the rest 4K word lines which are not refreshed, among the 8K word lines. Then, the second control circuit 420 performs an additional refresh operation on the word line including the weak cell.

That is, the refresh cycle of the 8K word lines in FIG. 7 is 32 ms+2*α. The word line including the weak cell is refreshed once while the 8K word lines are refreshed, and refreshed once at the section α. Thus, in the word line including the weak cell, three refresh operations are performed for (32 ms+2*α).

Figure 8:
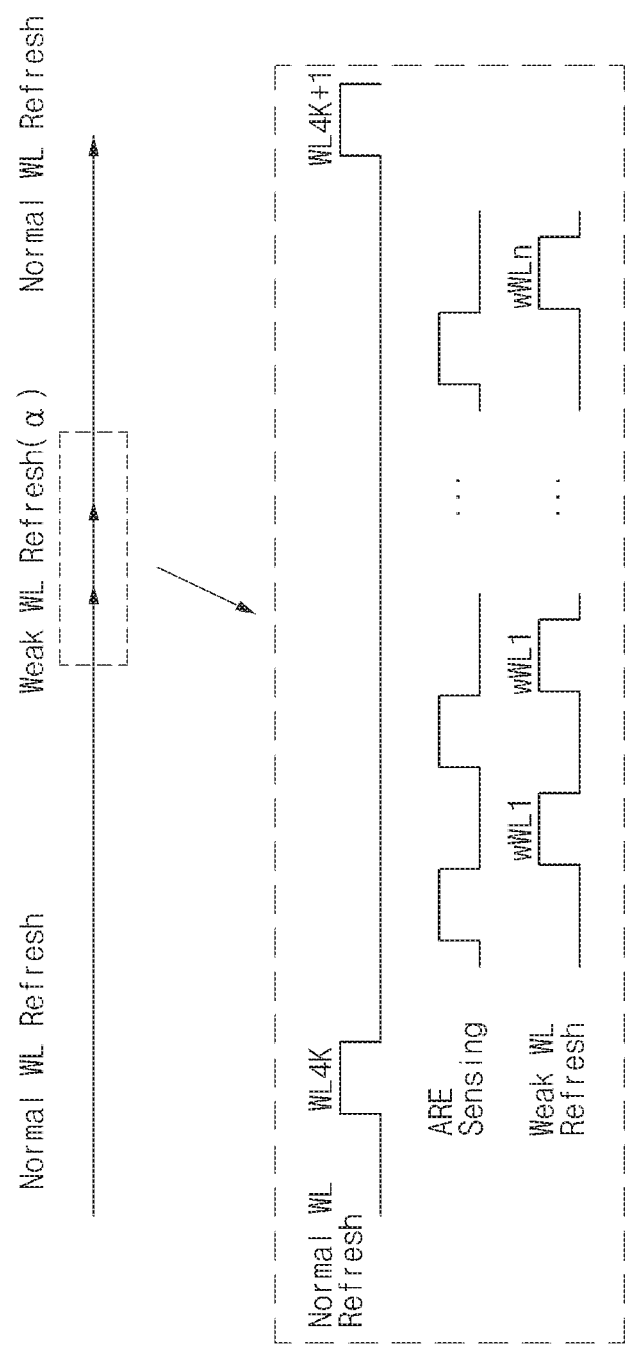
FIG. 8 is an expanded diagram illustrating a representation of an example of a section in which an additional refresh operation is performed.

FIG. 8 is an expanded diagram illustrating a representation of an example of the section (section α) in which the additional refresh operation of FIG. 7 is performed.

Referring to FIG. 8, an additional refresh operation is performed on n word lines wWL1 to wWLn including weak cells, before a refresh operation for a (4K+1)th word line WL4$k$+1 is started after a refresh operation for a 4Kth word line WL4$k$ is ended. The n word lines wWL1 to wWLn including weak cells are sequentially amplified (ARE sensing) and refreshed (Weak WL Refresh).

At this time, the first region 210 is accessed during a boot-up operation, and repair data stored in the first region 210 are all stored into the first latch circuit 310. However, data stored in the second region 220, for example, the addresses of the weak cells are accessed whenever an additional refresh operation is performed.

Like the data of the first region 210, the data of the second region 220 may be all stored into the second latch circuit 320 during a boot-up operation, and the second latch circuit 320 may be accessed. In this case, however, the area of the second latch circuit 320 is increased.

Thus, in a present embodiment, the second region 220 is directly accessed whenever the data of the second region 220 are needed, and the data are stored in the latch circuit 320 and then used.

When the data stored in the E-fuse array 200 are all stored into the first and second latch circuits 310 and 320 during a boot-up operation, the E-fuse array 200 is accessed only once during the boot-up operation. Thus, since transistors constituting the E-fuse array 200 are accessed a small number of times than transistors constituting typical memory cells, the transistors constituting the E-fuse array do not require high reliability.

In a present embodiment, however, the first and second regions 210 and 220 included in the E-fuse array 200 are accessed different numbers of times. For example, the addresses of fail cells, stored in the first region 210, are accessed only during a boot-up operation. However, the addresses of weak cells, stored in the second region 220, are accessed during each refresh operation.

Thus, transistors constituting the second region 220 of the E-fuse array 200 require higher reliability than transistors constituting the first region 210.

Figure 9:
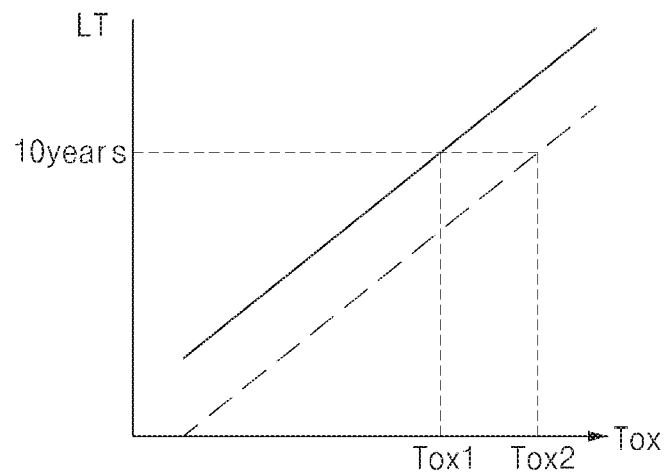
FIG. 9 is a graph illustrating a representation of an example the relation between the thickness of a gate oxide film of a transistor and the lifetime of the transistor.
Figure 10:
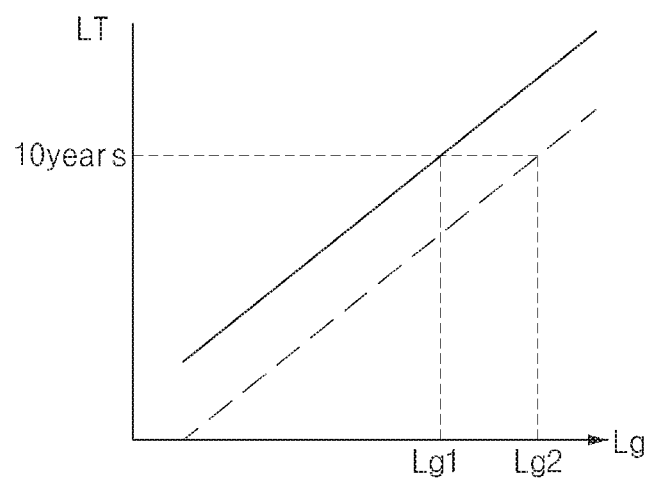
FIG. 10 is a graph illustrating a representation of an example the relation between the lifetime and gate length of the transistor.
Figure 11:
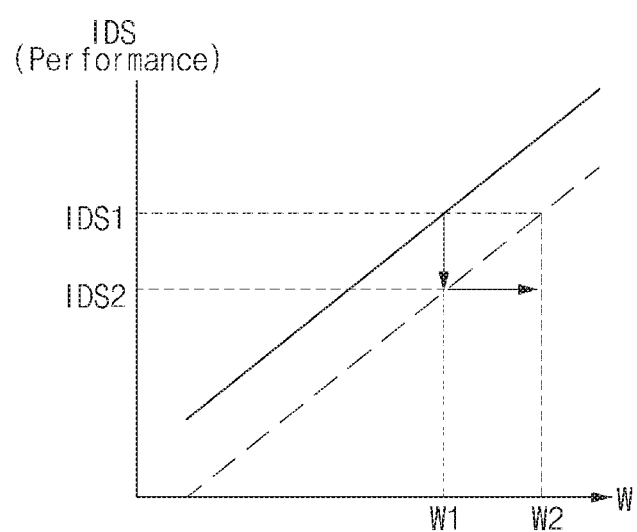
FIG. 11 is a graph illustrating a representation of an example the relation between the gate width and performance of the transistor.

FIG. 9 is a graph illustrating a representation of an example the relation between the thickness Tox of a gate oxide film of a transistor and the lifetime LT of the transistor, FIG. 10 is a graph illustrating a representation of an example the relation between the gate length Lg of a transistor and the lifetime LT of the transistor, and FIG. 11 is a graph illustrating a representation of an example the relation between the gate width W of a transistor and the performance IDS of the transistor.

The gate oxide film indicates an oxide film formed at the lowermost part of a gate structure formed over a substrate, in order to separate the substrate and the gate structure from each other in a vertical direction. The gate width indicates the length of the gate between the source and drain. The gate length indicates the thickness of the gate oxide film and the length of the gate perpendicular to the gate width.

Referring to FIG. 9, a solid line indicates a transistor constituting the first region 210, and a dotted line indicates a transistor constituting the second region 220. Referring to FIG. 9, the thickness Tox and lifetime LT of the gate oxide film of the transistor are proportional to each other.

However, the transistor of the first region 210 is accessed a smaller number of times than the transistor of the second region 220. Thus, the thickness Tox1 of the gate oxide film of the transistor in the first region 210, which is required to guarantee a lifetime of 10 years, may be set to a smaller value than the thickness Tox2 of the gate oxide film of the transistor in the second region 220.

Referring to FIG. 10, a solid line indicates a transistor constituting the first region 210, and a dotted line indicates a transistor constituting the second region 220. Referring to FIG. 10, the gate length Lg and lifetime LT of the transistor are proportional to each other.

However, the transistor of the first region 210 is accessed a smaller number of times than the transistor of the second region 220. Thus, the gate length Lg1 of the transistor in the first region 210, which is required to guarantee a lifetime of 10 years, may be set to a smaller value than the gate length Lg2 of the transistor in the second region 220.

FIG. 11 is a graph illustrating the relation between the gate width W and performance IDS of a transistor. Referring to FIG. 11, a dotted line indicates a transistor of which the gate oxide film has a larger thickness Tox or gate length Lg than a transistor indicated by a solid line.

As indicated by a downward arrow in FIG. 10, the current value IDS between the drain and source of the transistor decreases from IDS1 to IDS2 with the increase in thickness or gate length of the gate oxide film. At this time, the current IDS between the drain and source of the transistor indicates the performance of the transistor.

Thus, when the thickness or gate length of the gate oxide film of the transistor in the second region 220 is increased in order to raise the lifetime of the second region 220 to the same lifetime as the first region as illustrated in FIGS. 9 and 10, the performance of the transistor of the second region 220 is decreased.

Referring to FIG. 11, the gate width W of the transistor is proportional to the source-drain current IDS of the transistor, that is, the performance. Therefore, when the thickness and/or the gate length of the gate oxide film are increased in order to raise the lifetime of the transistor of the second region 220, the gate width W may be increased to guarantee the performance of the transistor of the second region 220.

That is, when the performance of the transistor of the second region 220 having a gate width W1 is reduced by the increase in thickness and/or gate length of the gate oxide film (refer to an arrow of FIG. 11), the gate width W1 may be increased to the gate width W2 in order to block the reduction of the performance.

The E-fuse array 200 according to a present embodiment has a different structure depending on the number of accesses.

In particular, the size of the transistor is reduced in the region (first region 210) which is accessed a small number of times, and the size of the transistor is increased in the region (second region 220) which is accessed a large number of times.

For example, one or more of the thickness and gate length of the gate oxide film of the transistor in the second region 220 may be larger than in the first region 210. Furthermore, the gate width of the transistor in the second region 220 may be larger than in the first region 210.

According to a present embodiment, the lifetime of the transistor in the second region 220 which is accessed a large number of times can be extended, which makes it possible to improve the reliability of the semiconductor device.

According to a present embodiment, the memory device can selectively perform a PPR operation and an additional refresh operation on a weak address, thereby improving the refresh efficiency.

Furthermore, in the E-fuse array where the number of accesses is different at each region, each region may include a different size of transistor. Thus, the durability of the E-fuse array can be improved. In an embodiment, a transistor included in the refresh cell array 122 has a different size from a transistor included in the repair cell array 123.

While certain embodiments have been described above, it will be understood to those skilled in the art that the embodiments described are by way of example only. Accordingly, the memory device described herein should not be limited based on the described embodiments. Rather, the memory device described herein should only be limited in light of the claims that follow when taken in conjunction with the above description and accompanying drawings.

What is claimed is:

1. A memory device comprising:
   a command controller configured to buffer an address based on a refresh enable signal and a repair enable signal;
   a fuse circuit configured to control a rupture operation of refresh cell array and repair cell array corresponding to the address according to the refresh enable signal and the repair enable signal, and output a refresh control signal and a repair control signal during a boot-up operation;
   a refresh controller configured to control a refresh operation of a bank according to a refresh control signal, based on activation of the refresh control signal; and
   a repair controller configured to control a repair operation of the bank according to a redundancy signal, based on activation of the repair control signal.

2. The memory device according to claim 1, wherein the refresh cell array and repair cell array include a plurality of fuse sets.

3. The memory device according to claim 1, wherein the refresh enable signal and the repair enable signal are complementarily activated.

4. The memory device according to claim 1, wherein the command controller comprises:
   an input circuit configured to combine the refresh enable signal and the repair enable signal;
   an address buffer configured to buffer the address; and
   a selection circuit configured to selectively transfer an output of the address buffer according to an output signal of the input circuit.

5. The memory device according to claim 4, wherein the selection circuit transmits the address as an internal address, at which at least one of the refresh enable signal and the repair enable signal is activated, to the fuse circuit.

6. The memory device according to claim 1, wherein the command controller comprises:
   a first input circuit configured to invert the repair enable signal and combine the refresh enable signal with the inverted repair enable signal;
   a second input circuit configured to invert the refresh enable signal and combine the repair enable signal with the inverted refresh enable signal;
   an address buffer configured to buffer the address; and
   a selection circuit configured to selectively transfer an output of the address buffer according to an output signal of the first and second input circuits.

7. The memory device according to claim 1, wherein the address is used by the refresh enable signal and the repair enable signal.

8. The memory device according to claim 1, wherein the fuse circuit comprises:
   a fuse controller configured to output a refresh rupture signal and a repair rupture signal for controlling a rupture operation of a fuse set corresponding to the address, according to the refresh enable signal and the repair enable signal;
   a refresh cell array where the fuse set is ruptured based on the refresh rupture signal;
   a repair cell array where the fuse set is ruptured based on the repair rupture signal; and
   an output controller configured to output the refresh control signal and the repair control signal which correspond to output data of the refresh cell array and the repair cell array during the boot-up operation.

9. The memory device according to claim 8, wherein the refresh cell array and the repair cell array comprise an ARE (Array Rupture Electrical fuse).

10. The memory device according to claim 9, wherein a transistor included in the refresh cell array has a different size from a transistor included in the repair cell array.

11. The memory device according to claim 1,
    wherein the refresh controller controls an additional refresh operation on a weak cell,
    wherein the repair controller controls a PPR (Post Package Repair) operation.

12. The memory device according to claim 1, wherein the refresh controller comprises:
    a refresh latch configured to latch the refresh control signal based on activation of a refresh command signal; and
    a counter configured to count an output of the refresh latch and output the refresh signal.

13. The memory device according to claim 12, wherein the refresh controller activates the refresh signal when data is stored in the refresh latch, and deactivates the refresh signal when no data is stored in the refresh latch.

14. The memory device according to claim 1, wherein the repair controller comprises:
    a repair latch configured to latch the repair control signal; and
    a redundancy control circuit configured to output the redundancy signal based on an output of the repair latch.

15. The memory device according to claim 1, wherein the refresh enable signal and the repair enable signal are set by an MRS (Mode Register Set).

16. A system comprising:
    a controller configured to generate a refresh enable signal, a repair enable signal, an address and a command signal; and
    a memory device configured to rupture a fuse set corresponding to the address based on the refresh enable signal and the repair enable signal, and control a refresh operation and a repair operation of a bank according to a refresh control signal and a repair control signal which correspond to data regarding the rupture of fuse cells during a boot-up operation.

17. The system according to claim 16,
    wherein the controller sets the refresh enable signal and the repair enable signal using an MRS (Mode Register Set),
    wherein the controller complementarily activates the refresh enable signal and the repair enable signal.

18. The system according to claim 16, wherein the memory device comprises:
- a command controller configured to buffer the address based on the refresh enable signal and the repair enable signal;
- a fuse circuit configured to control a rupture operation of a refresh cell array and repair cell array corresponding to the address according to the refresh enable signal and the repair enable signal, and output the refresh control signal and the repair control signal during the boot-up operation;
- a refresh controller configured to control a refresh operation of the bank according to a refresh control signal, based on activation of the refresh control signal; and
- a repair controller configured to control a repair operation of the bank according to a redundancy signal, based on activation of the repair control signal is activated.

19. The system according to claim 18, wherein the fuse circuit comprises:
- a fuse controller configured to output a refresh rupture signal and a repair rupture signal for controlling a rupture operation of a fuse set corresponding to the address, according to the refresh enable signal and the repair enable signal;
- a refresh cell array where the fuse set is ruptured based on the refresh rupture signal;
- a repair cell array where the fuse set is ruptured based on the repair rupture signal; and
- an output controller configured to output the refresh control signal and the repair control signal which correspond to output data of the refresh cell array and the repair cell array during the boot-up operation.

20. The system according to claim 18, wherein the refresh controller comprises:
- a refresh latch configured to latch the refresh control signal based on activation of a refresh command signal; and
- a counter configured to count an output of the refresh latch and output the refresh signal.

* * * * *